(12) United States Patent
Guo et al.

(10) Patent No.: US 8,519,454 B2
(45) Date of Patent: Aug. 27, 2013

(54) STRUCTURE AND PROCESS FOR METAL FILL IN REPLACEMENT METAL GATE INTEGRATION

(75) Inventors: Dechao Guo, Fishkill, NY (US); Shu-Jen Han, Cortlandt Manor, NY (US); Keith Kwong Hon Wong, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 13/075,443

(22) Filed: Mar. 30, 2011

(65) Prior Publication Data
US 2012/0248509 A1    Oct. 4, 2012

(51) Int. Cl.
*H01L 29/76*    (2006.01)
*H01L 21/338*   (2006.01)
*H01L 21/84*    (2006.01)

(52) U.S. Cl.
USPC ............ 257/288; 438/183; 438/157; 438/158

(58) Field of Classification Search
USPC ................. 257/288, E21.453; 438/157–158, 438/183, 926
See application file for complete search history.

(56) References Cited

U.S. PATENT DOCUMENTS

| | | | |
|---|---|---|---|
| 6,033,963 A | 3/2000 | Huang et al. | |
| 6,392,280 B1 | 5/2002 | Besser et al. | |
| 6,429,109 B1 | 8/2002 | Zheng et al. | |
| 6,756,277 B1 | 6/2004 | Yu | |
| 6,921,711 B2 | 7/2005 | Cabral, Jr. et al. | |
| 7,078,282 B2 | 7/2006 | Chau et al. | |
| 7,138,323 B2 | 11/2006 | Kavalieros et al. | |
| 7,148,548 B2 | 12/2006 | Doczy et al. | |
| 7,208,361 B2 | 4/2007 | Shah et al. | |
| 7,361,565 B2 * | 4/2008 | Shin et al. | 438/303 |
| 7,422,936 B2 | 9/2008 | Barns et al. | |
| 7,425,480 B2 | 9/2008 | Ozawa et al. | |
| 7,425,490 B2 * | 9/2008 | Kavalieros et al. | 438/299 |
| 7,572,704 B2 | 8/2009 | Oh et al. | |
| 7,741,230 B2 | 6/2010 | Rachmady et al. | |
| 2005/0093035 A1 * | 5/2005 | Yagishita et al. | 257/288 |
| 2005/0224880 A1 * | 10/2005 | Lee et al. | 257/347 |
| 2006/0091432 A1 * | 5/2006 | Guha et al. | 257/288 |
| 2008/0217747 A1 * | 9/2008 | Chudzik et al. | 257/635 |
| 2008/0265322 A1 * | 10/2008 | Lin et al. | 257/347 |
| 2009/0189201 A1 | 7/2009 | Chang et al. | |
| 2009/0206406 A1 * | 8/2009 | Rachmady et al. | 257/365 |

OTHER PUBLICATIONS

Kesapragada et al., "High-k / Metal Gate Stacks in Gate First and Replacement Gate Schemes", IEEE/SEMI Advanced Semiconductor Manufacturing Conference (ASMC), 2010, pp. 256-259.

* cited by examiner

*Primary Examiner* — Long K Tran
*Assistant Examiner* — Dzung Tran
(74) *Attorney, Agent, or Firm* — Joseph P. Abate; Roberts Mlotkowski Safran & Cole, P.C.

(57) ABSTRACT

Processes for metal fill in replacement metal gate integration schemes and resultant devices are provided herein. The method includes forming a dummy gate on a semiconductor substrate. The dummy gate includes forming a metal layer between a first material and a second material. The method further includes partially removing the dummy gate to form an opening bounded by a spacer material. The method further includes forming a recess in the spacer material to widen a portion of the opening. The method further includes removing a remaining portion of the dummy gate through the opening to form a trench having the recess forming an upper portion thereof. The method further includes filling the trench and the recess with a replacement metal gate stack.

22 Claims, 7 Drawing Sheets

STRUCTURE AND PROCESS FOR METAL FILL IN REPLACEMENT METAL GATE INTEGRATION

FIELD OF THE INVENTION

The invention relates to semiconductor structures and methods of manufacture and, more particularly, to processes for metal fill in replacement metal gate integration schemes and resultant devices.

BACKGROUND

Scaling of metal oxide semiconductor (MOS) devices is provided through many techniques. For example, a current technique is the use of metal replacement gates using a damascene scheme. In this approach, a dummy gate is formed on a semiconductor wafer through using standard polysilicon gate CMOS process flow. For example, a dielectric layer and polysilicon layer are deposited on the semiconductor substrate, which are then patterned to form the dummy gate. Source/drain regions can be formed on the semiconductor using conventional implantation processes. An insulator layer can then be deposited about the dummy gate. The insulator layer is then polished to expose the polysilicon layer of dummy gate. The dummy gate is then removed by reactive ion etching (RIE) and/or wet chemical etching to form to form a trench in the insulator layer.

To form the replacement metal gate, metal is then deposited within the trench. However, during the metal fill, metal begins to pinch-off the opening of the trench, prior to the trench being filled. When this occurs, a void or cavity is formed in the trench (due to the difficulty of filling capability). Accordingly, the void or cavity formation due to the pinch-off phenomenon, in turn, limit the scalability of this scheme for the future technology nodes.

Accordingly, there exists a need in the art to overcome the deficiencies and limitations described hereinabove.

SUMMARY

In a first aspect of the invention, a method comprises forming a dummy gate on a semiconductor substrate. The dummy gate comprises forming a metal layer between a first material and a second material. The method further comprises partially removing the dummy gate to form an opening bounded by a spacer material. The method further comprises forming a recess in the spacer material to widen a portion of the opening. The method further comprises removing a remaining portion of the dummy gate through the opening to form a trench having the recess forming an upper portion thereof. The method further comprises filling the trench and the recess with a replacement metal gate stack.

In another aspect of the invention, a method comprises forming a dummy gate on a semiconductor substrate. The method further comprises partially removing the dummy gate to form an opening. The method further comprises widening the opening by an etching process. The method further comprises removing remaining portions of the dummy gate to form a trench comprising the widened opening at an upper portion of the trench. The method further comprises filling the trench with a replacement metal gate stack.

In yet another aspect of the invention, a structure comprises at least one trench having a first cross section at an upper portion and a second cross section at a lower section. The first cross section at the upper portion is larger than the second cross section at the lower section. The structure further comprises a replacement metal gate stack within the at least one trench. The replacement metal gate stack has one or metals with a work function tailored for an NFET or PFET device. For example, in a P-channel transistor, titanium nitride (TiN) is deposited immediately after $HfO_2$ dielectric. However, adding aluminum to form TiAl tunes the work function for the N-channel transistors. The metal gate stack fills the at least one trench.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the replacement gate structure, which comprises the structures of the present invention. In still further embodiments, a method in a computer-aided design system is provided for generating a functional design model of the replacement gate structure. The method comprises generating a functional representation of the structural elements of the replacement gate structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to processes for metal fill in replacement metal gate integration schemes and resultant devices. More specifically, the present invention provides processing steps for integration of a replacement metal gate stack, with improved performance of the resultant device. For example, the present invention prevents pinch-off during metal fill processes of the replacement metal gate stack thereby ensuring complete metal fill in a previously formed trench. Accordingly, the processes of the prevent invention prevent the formation of a cavity in the trench during metal fill processes. This, in turn, increases the device performance and device yield during manufacturing processes. Advantageously, the present invention also reduces dielectric loss (e.g., undoped silica glass (USG)) during replacement gate formation, particularly in larger pitch devices, and is compatible with current processes, e.g., the processes of the present invention are suitable with nitride spacer as well as first and last silicide processes.

In embodiments, the present invention accomplishes these advantages by using a metal protection layer in a dummy gate structure, prior to the formation of the replacement gate stack. The metal protection layer, for example, reduces the dielectric loss during subsequent manufacturing processes. The metal protection layer also allows subsequent processes to widen an upper portion of the trench, compared to conventional processes. The wider portion of the upper portion of the trench prevents pinch-off during metal fill processes for the replacement metal gate stack.

Figure 1:
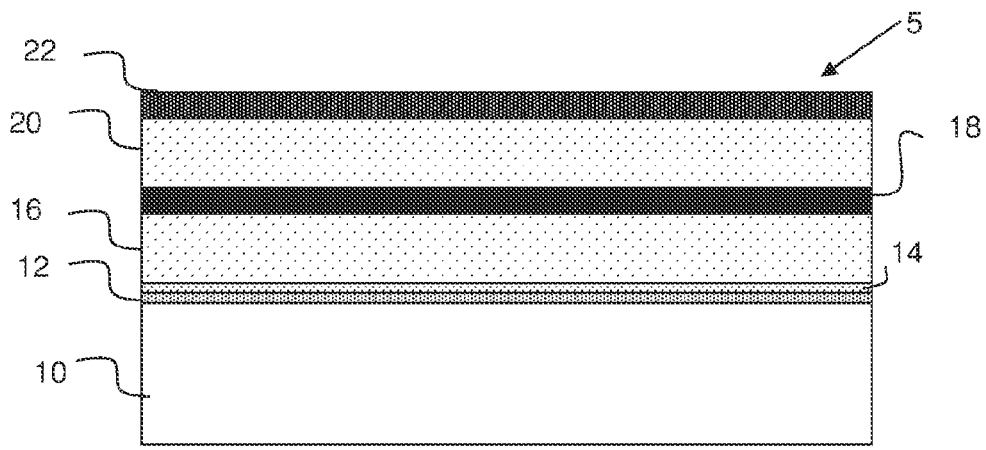
FIG. 1 shows a beginning structure and respective processing steps in accordance with aspects of the present invention.

FIG. 1 shows a beginning structure and respective processing steps in accordance with aspects of the present invention. The beginning structure 5 includes a wafer 10. In embodiments, the wafer 10 may comprise a bulk silicon or silicon on insulator (SOI) wafer. In the SOI implementation, the wafer 10 comprises semiconductor layer (e.g., active silicon) formed over an insulation layer. In the bulk silicon implementation, any isolation region or junction isolation is contemplated by the present invention. The constituent materials of the SOI wafer may be selected based on the desired end use application of the semiconductor device. For example, the buried insulation region may be composed of oxide, such as $SiO_2$, and may be referred to as BOX layer. Moreover, although the SOI wafer is referred to as "silicon on insulator," the semiconductor layer is not limited to silicon. Instead, the semiconductor layer may be comprised of various semiconductor materials, such as, for example, Si, SiGe, SiC, SiGeC, etc. The SOI wafer may be fabricated using techniques well known to those skilled in the art. For example, the SOI wafer may be formed by conventional processes including, but not limited to, oxygen implantation (e.g., SIMOX), wafer bonding, etc.

Still referring to FIG. 1, an interfacial layer 12 is formed over the wafer 10. The interfacial layer 12 may be, for example, composed of oxide, such as $SiO_2$ or silicon oxy nitride. The interfacial layer 12 may be deposited using any known deposition method such as, for example, chemical vapor deposition (CVD) processes or thermal oxidation or wet chemical oxidation. A dielectric layer 14 is formed on the interfacial layer 12. In embodiments, the dielectric layer 14 can be any high-k dielectric layer such as, for example, hafnium oxide, hafnium silicide, hafnium aluminum oxide or zirconium oxide or silicate or any combination thereof in a stacked structure. The thickness of the dielectric layer 14 can about 1 nm to 4 nm or other dimensions depending on the particular application of the present invention. As with the interfacial layer 12, the dielectric layer 14 can be deposited using any conventional deposition method such as, for example, CVD.

A polysilicon layer 16 is formed on the dielectric layer 14. The polysilicon layer 16 can be formed by any conventional deposition process such as, for example, a CVD, to thickness of about one third to two thirds the total gate height, depending on the specific application of the present invention. A sacrificial metal layer 18 is formed on the polysilicon layer 16. The sacrificial metal layer 18 can be any metal or metal alloy such as, for example, TiN. In embodiments, the sacrificial metal layer 18 is deposited on the polysilicon layer 16 using conventional deposition processes such as, for example, a sputtering technique or atomic layer deposition (ALD) processes. The sacrificial metal layer 18 can be deposited to a thickness of about 15 Å to 50 Å; although, other dimensions are also contemplated by the present invention. In embodiments, the range of 15 Å to 50 Å provides an adequate etch stop for subsequent processes in accordance with the present invention. More specifically, the thickness of about 15 Å to 50 Å of the sacrificial metal layer 18 will protect the underlying polysilicon layer 16 during processes to widen the opening of a trench, as discussed in more detail below.

FIG. 1 further shows the formation of an additional polysilicon layer 20. The additional polysilicon layer 20 is deposited on the sacrificial metal layer 18 using conventional deposition processes such as, for example, CVD. A hardmask 22 is formed on the additional polysilicon layer 20 using, for example, conventional deposition methods such as CVD. In embodiments, the hardmask 22 can be, for example, oxide or SiN.

Figure 2:
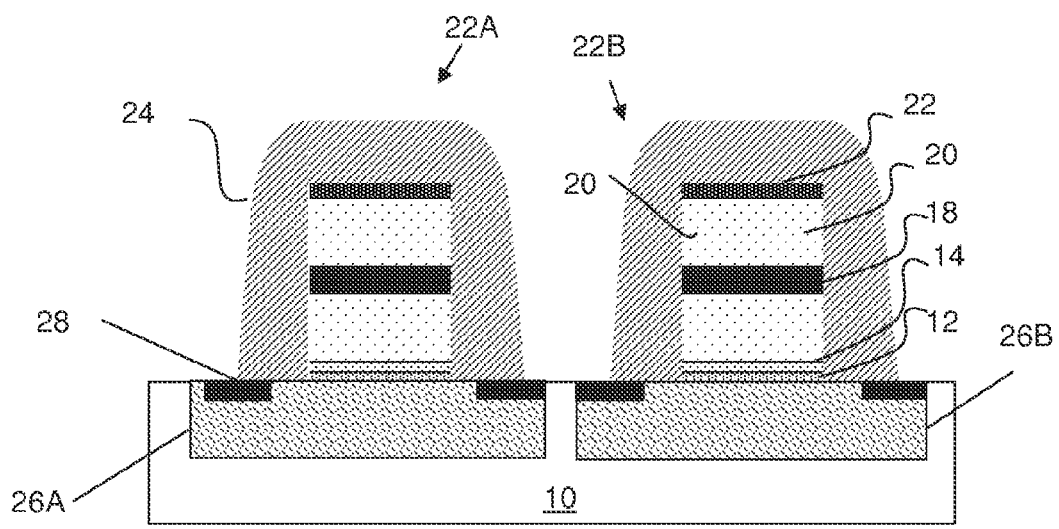
FIGS. 2-11 show additional structures and respective processing steps in accordance with aspects of the present invention.

FIG. 2 shows additional processing steps and respective structure in accordance with aspects of the present invention. More specifically, FIG. 2 shows the formation of dummy gate structures 22A and 22B. In embodiments, the dummy gate structure 22A is for an NFET device formed on an active area 26A; whereas, the dummy gate structure 22B is for a PFET device formed on an active area 26B. In embodiments, the dummy gates 22A and 22B can be formed using conventional lithographic and etching processes. For example, the lithography step may entail applying a photoresist, exposing the photoresist to a pattern of radiation, and developing the pattern utilizing a conventional resist developer. Following the lithography step, a conventional etching process such as reactive-ion etching (RIE) may be employed in transferring the pattern to the dummy gate structures 22A and 22B.

In further embodiments, a spacer 24 can be formed on the dummy gate structures 22A and 22B, e.g., surround the dummy gate structures 22A and 22B. In embodiments, the spacer 24 is a nitride spacer which can impose a stress layer on subsequently formed metal gate structures. More specifically, the nitride spacer 24 may impose a tensile stress for a NFET and a compressive stress for a PFET. Source/drain regions 28 can also be formed in a conventional manner such as, for example, any known conventional doping techniques at conventional energies and concentrations such that no further discussion is required herein for an understanding of the present invention. In alternative embodiments, the spacer 24 can be an oxide material.

Figure 3:
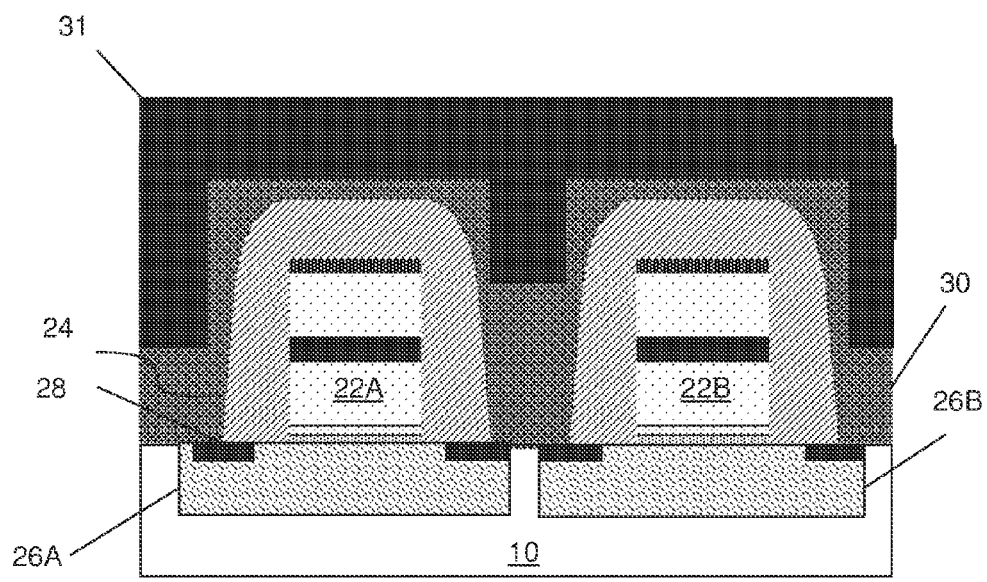

In FIG. 3, a high stress layer 30 is formed on the structure of FIG. 2. More specifically, a nitride stress layer 30 is formed over the dummy gate structures 22A and 22B, e.g., directly in contact with the nitride spacer 24. In embodiments, the nitride stress layer 30 can be formed using any conventional deposition process such as, for example, a conformal deposition using CVD. In further embodiments, the nitride stress layer 30 may impose an additional tensile stress for a NFET and an additional compressive stress for a PFET. A dielectric layer 31 such as, for example, oxide or USG, can be deposited on the nitride stress layer 30.

Figure 4:
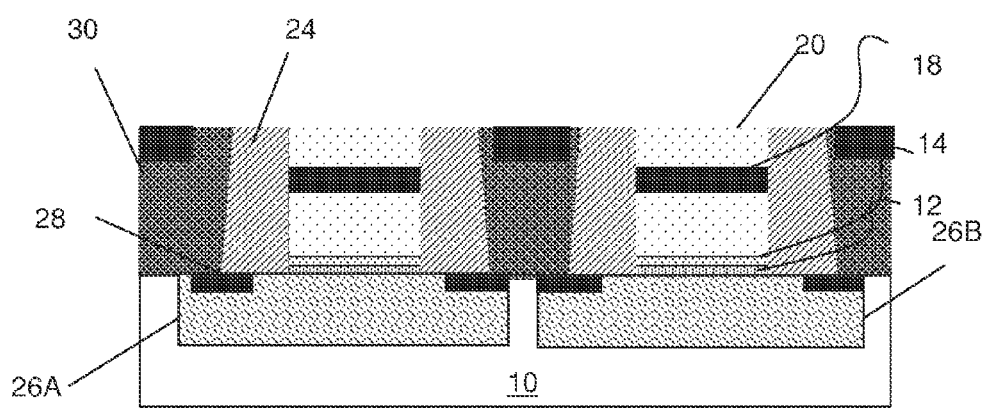

In FIG. 4, the portions of the dielectric layer 31 and the nitride stress layer 30 may be removed to expose the additional polysilicon layer 20. For example, the structure of FIG. 4 can undergo a chemical mechanical polish (CMP) to expose the additional polysilicon layer 20. In embodiments, the structure will first undergo a CMP to remove a portion of the dielectric layer 31, with the nitride stress layer (hardmask) 30 acting as a polish stop layer. Thereafter, the nitride stress layer 30 can be removed to expose the additional polysilicon layer 20.

Figure 5:
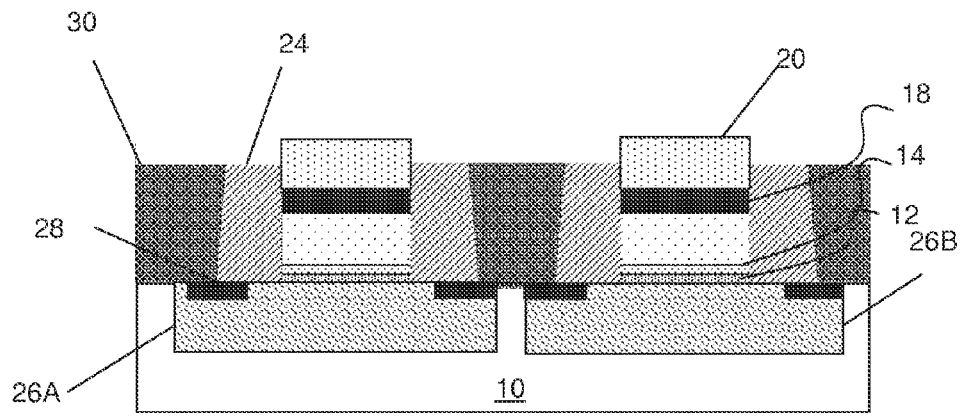

In FIG. 5, a controlled etching process is performed to recess the nitride stress layer 30 and nitride spacer 24 below an upper surface of the dummy gate structures 22A and 22B. In embodiments, the controlled etching process is a selective reactive ion etching (RIE) process to remove portions of the nitride stress layer 30 and the nitride spacer 24. The selective RIE process will not attack the additional polysilicon layer 20 such that, for example, the additional polysilicon layer 20 will remain above the recessed nitride stress layer 30 and the nitride spacer 24.

Figure 6:
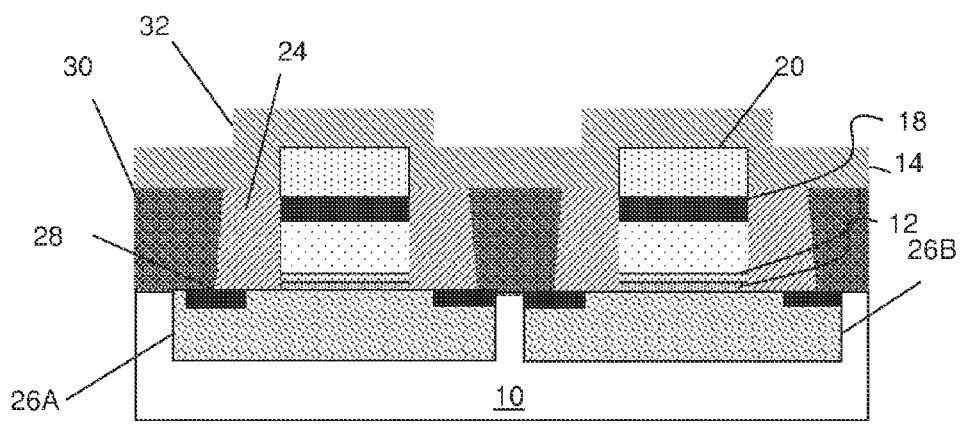

In FIG. 6, a sacrificial metal layer 32 is formed on the exposed additional polysilicon layer 20 and the recessed nitride stress layer 30. The sacrificial metal layer 32 can be any inexpensive metal such as, for example, TiN or other inexpensive metal or metal alloys. The sacrificial metal layer 32 may be deposited to a depth of about 100 Å to 200 Å; although, other dimensions are contemplated by the present invention.

Figure 7:
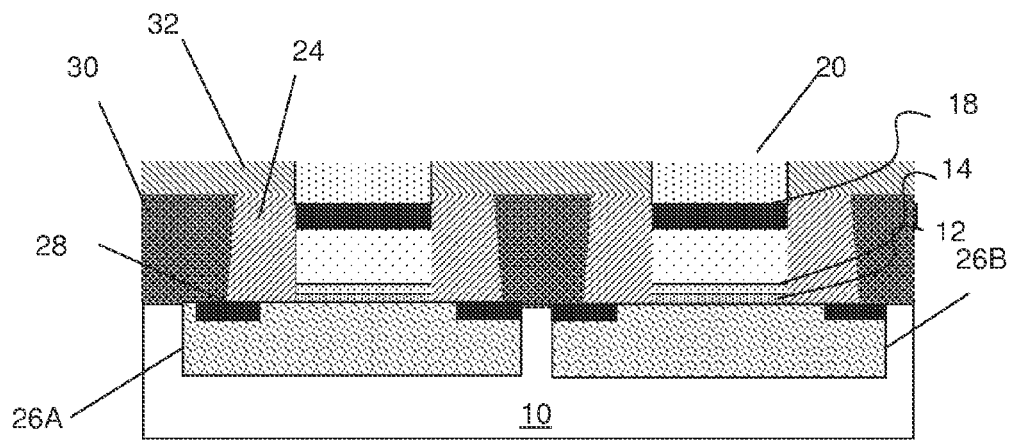

As shown in FIG. 7, the sacrificial metal layer 32 is polished using, for example, a CMP process. The CMP of the sacrificial metal layer 32 again exposes the additional polysilicon layer 20.

Figure 8:
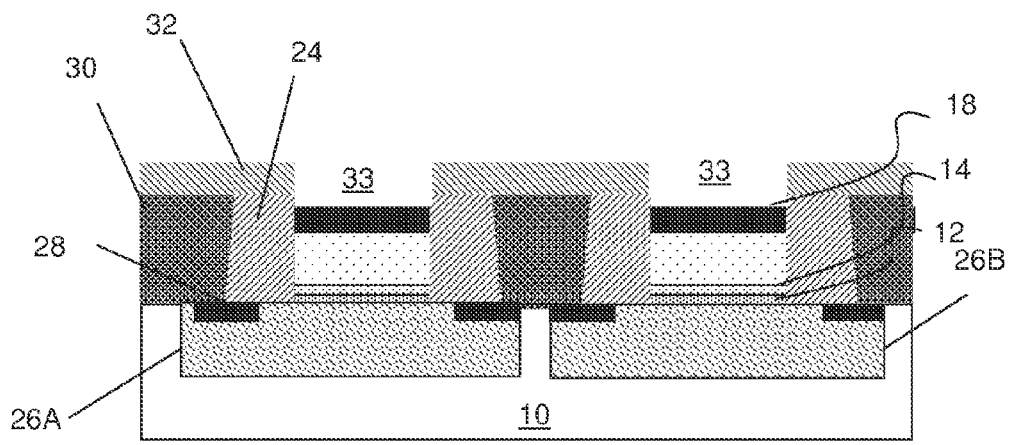

In FIG. 8, the exposed additional polysilicon layer 20 is then removed to expose the metal layer 18, thereby forming an opening 33. In this process, the sacrificial metal layer 32 can protect the non-gate areas, e.g., shallow trench isolation (STI), metal wiring layers, other devices, etc. Also, the metal layer 18 will stop the etching process from removing the remaining polysilicon layer 16.

Figure 9:
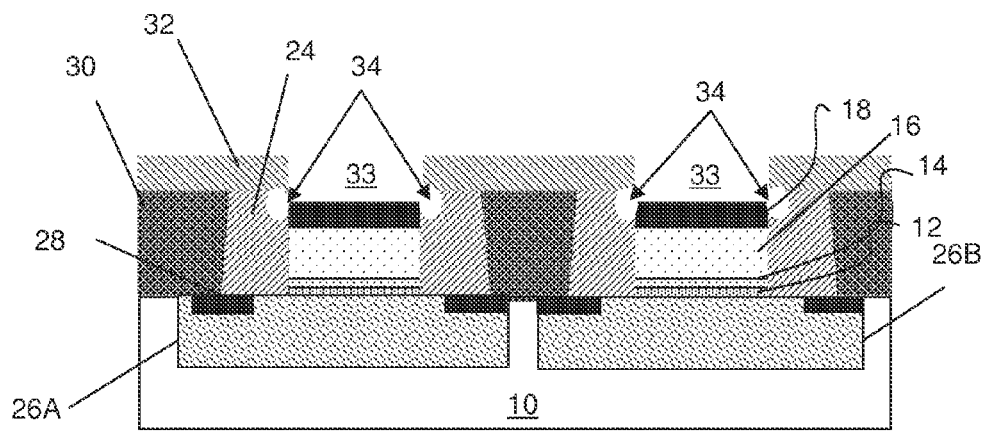

As shown in FIG. 9, one or more recesses or undercuts (e.g., bottleneck) 34 are formed in the spacer 24, adjacent to ends of the metal layer 18, to widen the opening 33. The widening of the opening 33 will prevent pinch-off and the formation of a cavity in subsequent metal fill processes for the replacement metal gate stack. In embodiments, the recesses 34 can range from about 10% to about 30% of the diameter (cross-section) of the opening 33; although, other dimensions are contemplated by the present invention to widen the opening 33. In embodiments, the recesses 34 are formed by a wet etch process such as, for example, hot phosphorous etching techniques, which provide a high etching rate for SiN, but a low etch rate for metals (e.g., metal layer 18 and sacrificial metal layer 32) and polysilicon (e.g., polysilicon layer 16). In embodiments, the recesses 34 can be formed by dilute HF (DHF) or HF processes when the spacers 24 are of an oxide material. Advantageously, the formation of the recesses 34 is compatible with current process of record (POR) for replacement metal gate processes. Also, there is no requirement for any additional masks for the formation of the recesses 34, thereby reducing overall processing time and costs.

Figure 10:
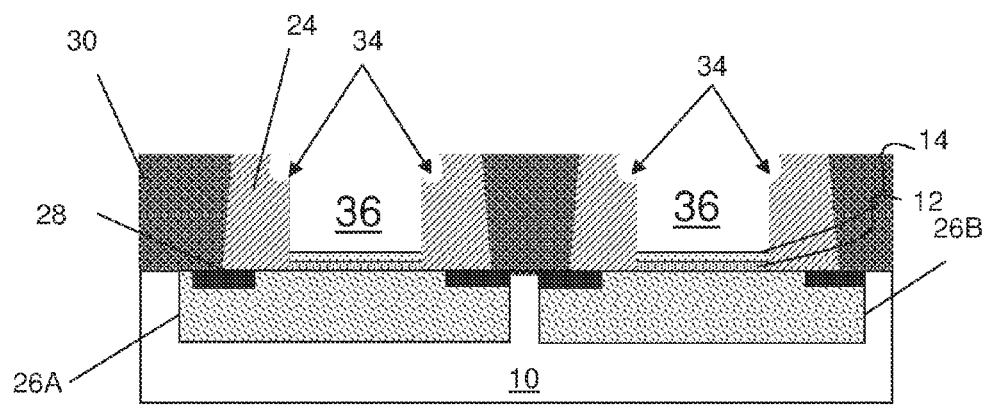

In FIG. 10, the metal layer 18 and the polysilicon layer 16 are removed to form a trench 36. In embodiments, the metal layer 18 and the polysilicon layer 16 can be removed by conventional etchants. For example, the metal layer 18 can be removed by a first etchant selective to the metal and the polysilicon layer 16 can be removed by a second etchant selective to polysilicon. As shown in FIG. 10, upon the removal of the metal layer 18 and the polysilicon layer 16, the trench 36 will have a wider opening at the upper portion compared to the remaining portion of the trench 36. This is due to the previous formation of the recesses 34 at the upper portion (e.g., mouth) of the trench 36. The wide opening at the upper portion (e.g., mouth) of the trench 36 will prevent pinch-off and the formation of a cavity in subsequent metal fill processes for the replacement metal gate stack.

Figure 11:
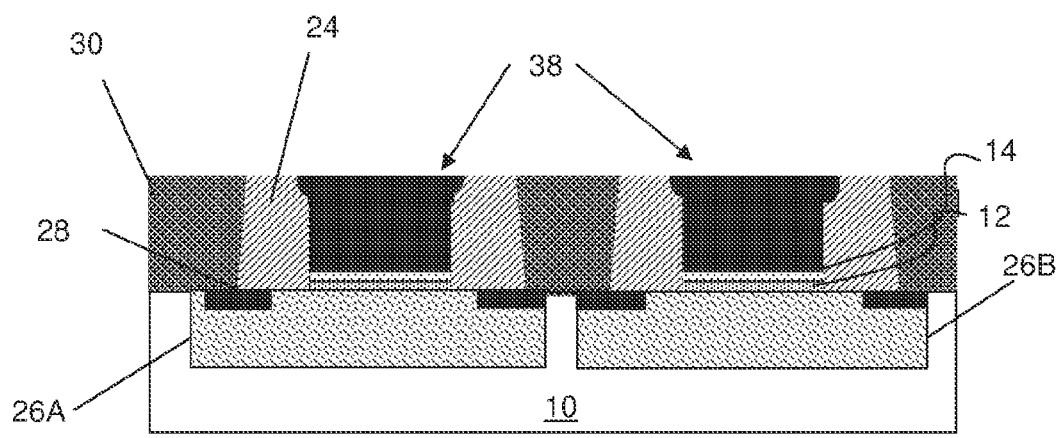

In FIG. 11, a replacement metal gate structure 38 is formed in the trench 36. In embodiments, the replacement metal gate structure 38 comprises a stack of metal layers tailored to a specific work function for an NFET and a PFET. For example, the PFET metal gate stack may include a titanium nitride layer having a thickness of about 40 Å to about 100 Å following by a stack of Ti (20 Å to 50 Å) and aluminum; although, other metals with the same or different dimensions are also contemplated by the present invention. In any scenario, though, the recesses 34 prevent pinch-off of the trench 36 during metal formation during metal deposition due to the wide opening. This, in turn, prevents cavity formation in the trench. In embodiments, after metal fill, the structure can then be polished. In further embodiments, the stressor layers can also be replaced during the polishing step, and replaced with replacement stress materials.

Figure 12:
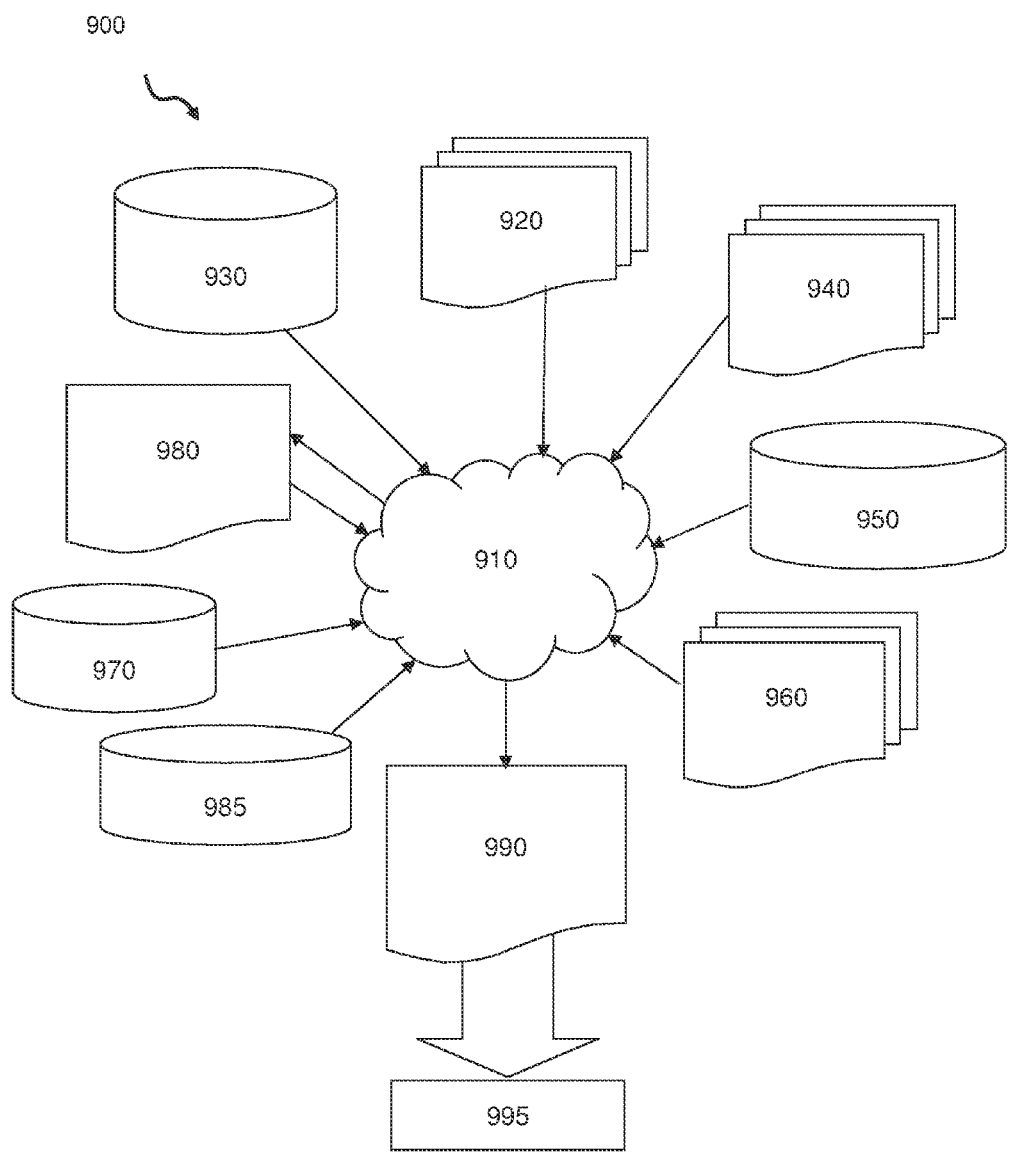
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
   forming a dummy gate on a semiconductor substrate, the dummy gate comprising forming a metal layer between a first material and a second material and bounded by a spacer material;
   planarizing a top portion of the dummy gate to be planar with a stress material formed on the spacer material;
   partially removing the dummy gate by removing the second material and exposing the metal layer to form an opening bounded by the spacer material;
   forming a recess in the spacer material adjacent to the exposed metal layer to widen a portion of the opening;
   removing a remaining portion of the dummy gate through the opening to form a trench having the recess forming an upper portion thereof; and
   filling the trench and the recess with a replacement metal gate stack.

2. The method of claim 1, wherein the spacer material is a nitride spacer deposited around the dummy gate prior to the removing.

3. The method of claim 1, wherein the forming the dummy gate comprises:
   forming the first material on a dielectric layer;
   forming the metal layer on the first material, which acts as an etch stop;
   forming the second material on the metal layer;
   forming a mask layer on the second material;
   patterning the dielectric layer, the first material, the metal layer and the second material to form a dummy gate structure;
   depositing the spacer material on the dummy gate structure to form a spacer; and
   providing a stress material over the spacer.

4. The method of claim 3, wherein the first material and the second material are polysilicon, separated by the metal layer.

5. The method of claim 3, wherein the partially removing the dummy gate and forming the recess comprises:
   polishing the spacer material and the stress material to expose the second material;
   recessing the spacer material and the stress material below an upper surface of the second material;
   forming a sacrificial metal layer on the spacer material and the stress material and exposed portions of the second material;
   polishing the sacrificial metal layer to expose the second material;
   removing the second material to form the opening of the trench and to expose the metal layer within the dummy gate; and
   forming the recess in the spacer material, on the side of the opening.

6. The method of claim 5, wherein the metal layer protects the first material during the forming of the recess and the sacrificial metal layer protects remaining structures during the recess formation.

7. The method of claim 5, wherein the forming the recess comprises a wet etch process.

8. The method of claim 7, wherein the wet etch process comprises a hot phosphorous etching technique, which provides a high etching rate for the spacer material and a lower etching rate for the metal layer and the sacrificial metal layer.

9. The method of claim 1, wherein the spacer material is oxide and the forming the recess comprises dilute HF (DHF) or HF processes.

10. The method of claim 9, wherein the recess widens the opening to about 10% to about 30% more of a cross-section of the opening.

11. The method of claim 1, wherein the recess widens the opening to about 10% to about 30% of a cross-section of the opening.

12. A method comprising:
    forming a dummy gate on a semiconductor substrate;
    planarize the dummy gate to be planar with a stress material formed on a spacer;
    partially removing the dummy gate to form an opening below a surface of the stress material;
    widening the opening by etching the spacer subsequent to partially removing the dummy gate;
    removing remaining portions of the dummy gate to form a trench comprising the widened opening at an upper portion of the trench; and
    filling the trench with a replacement metal gate stack.

13. The method of claim 12, wherein the widening the opening is formed by wet etching a spacer material that forms the spacer which is deposited around the dummy gate prior to the opening.

14. The method of claim 13, wherein the forming the dummy gate comprises:
    forming a first material on a dielectric layer;
    forming the metal layer on the first material, which acts as an etch stop;
    forming a second material on the metal layer;
    forming a mask layer on the second material;
    patterning the dielectric layer, the first material, the metal layer and the second material to form a dummy gate structure;
    depositing the spacer material on the dummy gate structure to form the spacer; and
    providing the stress material over the spacer.

15. The method of claim 14, wherein the first material and the second material are polysilicon, separated by the metal layer.

16. The method of claim 14, wherein:
    the partially removing the dummy gate to form an opening comprising:
       polishing the spacer material and the stress material to expose the second material;
       recessing the spacer material and the stress material below an upper surface of the second material;
       forming a sacrificial metal layer on the spacer material and the stress material and exposed portions of the second material;
       polishing the sacrificial metal layer to expose the second material;
       removing the second material to form the opening and to expose the metal layer; and
    forming a recess in the spacer material, on the side of the opening.

17. The method of claim 16, wherein the metal layer protects the first material during the forming of the recess and the sacrificial metal layer protects remaining structures during the recess formation.

18. The method of claim 12, wherein the widening the opening forms a recess in the spacer which is about 10% to about 30% of a cross-section of the opening.

19. The method of claim 12, wherein the replacement metal gate stack comprising depositing a plurality of metals within the trench which have a tailored work function for either an NFET or PFET.

20. A structure comprising:

at least one trench having a first cross section at an upper portion and a second cross section at a lower section, the first cross section at the upper portion being an undercut at an upper portion of the spacer material and which is larger than the second cross section at the lower section; and a replacement metal gate stack within the at least one trench, the replacement metal gate stack having one or metals with a work function tailored for an NFET or PFET device, the metal gate stack filling the at least one trench including the undercut, the replacement metal gate stack further having a planar surface with a top surface of an adjacent stress layer formed on a spacer.

21. The method of claim 12, wherein the partially removing the dummy gate exposes a metal layer and to form an opening to a level below the stress material.

22. The method of claim 21, wherein the removing remaining portions of the dummy gate includes removing the metal layer to form the trench.

\* \* \* \* \*